United States Patent [19]

Montroll et al.

[11] Patent Number: 4,744,089
[45] Date of Patent: May 10, 1988

[54] MONOLITHIC SEMICONDUCTOR LASER AND OPTICAL AMPLIFIER

[75] Inventors: Andrew H. Montroll, Reston, Va.; Steven H. Macomber, Bethel, Conn.

[73] Assignee: The Perkin-Elmer Corporation, Norwalk, Conn.

[21] Appl. No.: 864,348

[22] Filed: May 19, 1986

[51] Int. Cl.[4] ................................................ H01S 3/19
[52] U.S. Cl. ........................................ 372/50; 372/96
[58] Field of Search ............................ 372/50, 96, 43

[56] References Cited

U.S. PATENT DOCUMENTS 4,573,158 2/1986 Utaka et al. ............................ 372/32

OTHER PUBLICATIONS

Burnham et al; "Large Collimated Output Beams"; Xerox Disclosure Journal, vol. 4, No. 3; May/Jun. 1979, pp. 363-364.

Primary Examiner—James W. Davie
Assistant Examiner—B. Randolph
Attorney, Agent, or Firm—Thomas P. Murphy; Edwin T. Grimes; Francis L. Masselle

[57] ABSTRACT

An integrated semiconductor source of high-power, single spatial mode, narrow spectral mode modulated radiation. A frequency selective feedback laser diode is disposed on the same semiconductor crystal with a power amplifier having a diverging active area which causes emitted light to be distributed over a large exit facet area.

8 Claims, 1 Drawing Sheet

MONOLITHIC SEMICONDUCTOR LASER AND OPTICAL AMPLIFIER

BACKGROUND OF THE INVENTION

The present invention relates to semiconductor laser devices providing high power coherent radiation and, more particularly, relates to such devices utilizing frequency selective feedback type laser diodes integral with optical amplifiers having a diverging active region.

Conventional narrow stripe lasers are capable of producing good laser mode characteristics but are limited in their output power due to facet damage effects and heating effects at high input currents. Wide stripe semiconductor lasers, which provide high power, produce poor mode characteristics. The present invention overcomes these problems by providing an integrated semiconductor laser device which combines a frequency selective feedback laser and a power amplifier and is capable of emitting high power laser radiation with good mode characteristics.

A frequency selective feedback type laser diode is understood to be any diode laser which emits energy having a single longitudinal mode and in which the mechanism for producing the internal optical feedback within the device, as required for lasing, is that of a periodic structure along the length of the diode. This periodic structure can be effected by various approaches and the present invention is not limited to any single approach. One such approach is to generate a periodic grating within the diode. See, *Integrated Optics,* Vol. 7, T. Tamir (ed.), E. Gamire, "Semiconductor Components For Monolithic Applications". Another possible approach for generating a periodic structure is that of periodic current confinement. See, U.S. Pat. Nos. 4,445,218 and 4,359,776. Other approaches are known in the prior art in which a periodic structure is etched, diffused, electrically produced or otherwise achieved such that feedback and, consequently, lasing occurs.

Also, known are various types of semiconductor optical amplifiers such as those described in *Semiconductor Optical Amplifiers,* S. Kobayashi and T. Kimura, IEEE Spectrum, May 1984, pp 26–33. Prior art amplifiers, however, have found application in areas, such as communication, where very weak signals are restored to their original strength, and no attempt is made to achieve high power.

The present application is related to U.S. patent application Ser. No. 780,879, U.S. Pat. No. 4,713,821 entitled "Semiconductor Laser and Optical Amplifier", filed on Sept. 27, 1985, and assigned to the same assignee as the present invention.

The aforementioned application discloses a semiconductor light generating device which comprises a laser diode (LD) having an output facet cleaved apart from, and optically coupled to, an optical power amplifier (OA). The OA is formed so that its active region diverges in the forward direction. The laser beam diverges by diffraction as it leaves the LD and expands within the medium of the diverging active region of the OA so that the output laser beam is distributed over a wider area of the output facet of the OA than would be the case without the divergence. Pumping current injected into the OA establishes the gain, or amplification, required to maintain constant optical power density within the amplifier active region from the entrance facet to the exit facet, eliminating both gain saturation and facet damage.

The above-described application overcame two serious problems associated with semiconductor diode optical amplifiers: gain saturation and degradation and catastrophic failure of the facet.

A possible problem that the invention in the above-referenced application has is presented by the cleave between the LD and the OA. The active area in both the LD and 0A must be of the same thickness and coplanar. In practice these requirements may be difficult to achieve since two discrete devices must be mechanically mounted in close proximity with critical tolerances in order to achieve optical coupling. While it is possible to cleave and couple laser devices, each unit must be cleaved individually thus increasing the manufacturing time and the variability among the laser/amplifier units.

Our contribution to the art is to improve the above-described device by providing a monolithic semiconductor laser device which combines a frequency selective feedback laser integral with an optical amplifier having a diverging active region. The LD and the OA are optically and physically coupled and the device is capable of producing coherent radiation at high power with good mode characteristics. As with the device disclosed in the co-pending application the present invention overcomes gain saturation and degradation of the amplifier and catastrophic failure of the facets.

BRIEF DESCRIPTION OF THE INVENTION

The present invention relates to a semiconductor coherent radiation generating device. A semiconductor frequency selective feedback master oscillator laser diode (MO) is formed integral with an optical power amplifier (PA), the integral unit thus formed being termed a MOPA.

The MO produces a beam of coherent radiation characterized by having a single spatial and single spectral mode. The integral MOPA is formed with separate electrical contacts for the MO and PA so that they can be separately pumped by the applied electrical current. The laser beam diverges or is caused to diverge as it leaves the MO and expands within the medium of the diverging active region of the PA so that the output laser beam is distributed over a wider area of the output facet of the OA than would be the case without the divergence. Exciting current injected into the PA establishes the gain, or amplification, required to maintain constant optical power density within the amplifier active region from the entrance of the PA active region to the exit facet of the PA, eliminating facet damage while providing a high power output.

There has thus been outlined rather broadly the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception on which the disclosure is based may readily be utilized as a basis for designing other structures for carrying out the several purposes of the invention. It is important, therefore, that the claims be regarded as including such equivalent structures as do not depart from the spirit and scope of the invention.

Specific embodiments of the invention have been chosen for purposes of illustration and description, and are shown in the accompanying drawings, forming a part of the specification.

DETAILED DESCRIPTION OF A PREFERRED EMBODIMENT

Figure 1:
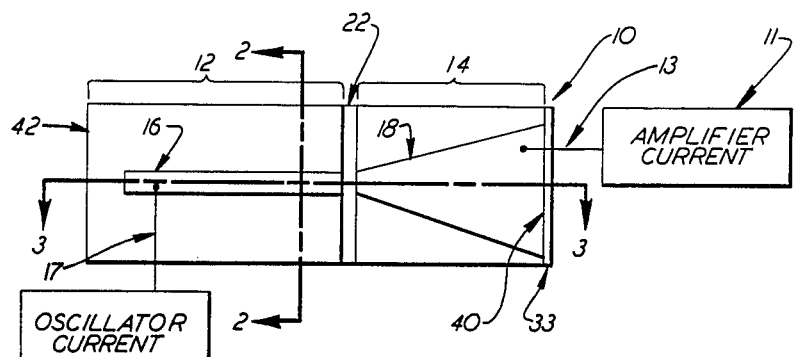
FIG. 1 is a plan view of one embodiment of the MOPA of the present invention.

The advantages and improvements of the present invention over the prior art can best be understood after consideration of the Figures. Accordingly, FIG. 1 shows a plan view of one embodiment of a master oscillator power amplifier (MOPA) 10. The MOPA 10 is an integral semiconductor crystal with two sections, the master oscillator section (MO) 12 and the power amplifier section (PA) 14. Facets 40 and 42 of the MO PA 10 are made anti-reflecting in any convenient manner such as by the addition of an anti-reflecting coating 33.

While the description that follows holds the MO 12 to be a distributed feedback semiconductor laser diode, see, *Integrated Optics,* supra, it should be understood that any of the frequency selective feedback laser diode approaches previously described have equal effect and applicability in the present invention.

Current is injected into the semiconductor crystal at two separate points. The MO 12 has current injected at the narrow stripe 16 by oscillator current source 15 supplied through the positive connector 17 and negative connector, not shown. The PA 14 has current injected at the amplifier stripe 18 by amplifier current source 11 supplied through the positive connector 13 and negative connector, not shown. The narrow stripe 16 and amplifier stripe 18 are electrically isolated from one another by a dielectric material 22, such as $SiO_2$. The current flow generated by the oscillator current source 15 can be either continuous or modulated so as to modulate the coherent radiation emanating from the MO 12 while the current supplied to the PA 14 is constant and direct. The current supplied to the MO 12 does not disturb that supplied to the PA 14 since they are isolated fom each other by the dielectric material 22.

Figure 2:
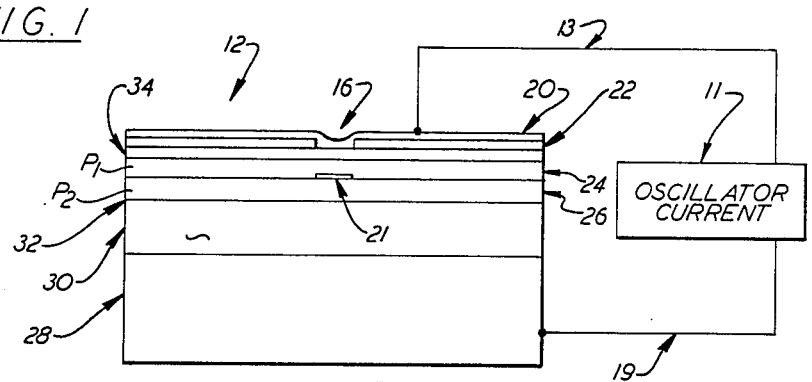
FIG. 2 is a lateral cross-section of the MOPA of FIG. 1.

FIG. 2 shows the MO 12 of FIG. 1 in cross-section. The MO 12 is built upon a substrate 28 of, for example, GaAs. The MO 12 comprises an active region 32 which is disposed between a lower cladding layer 26 doped with a p-dopant and an n layer 30 doped with an n-dopant. Typically, the active region 32 is a small bandgap aluminum gallium arsenide ($Al_{0.03}Ga_{0.97}As$) layer, and layers 26 and 30 are larger bandgap aluminum gallium arsenide ($Al_{0.3}Ga_{0.7}As$), creating an optical waveguide in a plane perpendicular to the junction between the lower cladding and n layers. Disposed above the lower cladding layer 26 is an upper cladding layer 24 doped with a p-dopant which is composed of a material with a different index of refraction than the lower cladding layer 26, typically $Al_{0.4}Ga_{0.6}As$.

Onto the lower cladding layer 26, and substantially below the narrow stripe 16 is a grating pattern 21 the characteristics of which are described in reference to FIG. 3. This grating pattern is generated on the lower cladding layer 26 by, for example, known holographic techniques. See, e.g., *Integrated Optics,* Vol. 7, T. Tamir (ed.), E. Garmire, "Semiconductor Components For Monolithic Applications", (1979). The width of the grating pattern 21 is at least that of the narrow stripe 16 and its length is substantially that of the narrow stripe 16.

For the materials described hereinabove in reference to the upper cladding layer 24, the lower cladding layer 26 and the n layer, a typical p - dopant is zinc (Zn) and a typical n-dopant is tellurium (Te).

Overlaying the upper cladding layer 24 is a cap 34 of, for example, Ga As. The cap 34 serves to protect the upper cladding layer 24 during fabrication of the MO 12 and also conducts current injected by the oscillator current source 11 through the metallic layer 20 and upper cladding layer 24. The width of the narrow stripe 16 is defined by a gap in the dielectric layer 22 which overlays the cap 34. The metallic layer 20 is of, for example, Cr-Au and the dielectric layer is, for example, of $SiO_2$.

The master oscillator current source 11 supplies current in the manner hereinabove described to the MO 12 through positive electrical line 13, electrically connected to the metallic layer 20, and negative electrical line 19, electrically connected to the substrate 28.

Figure 3:
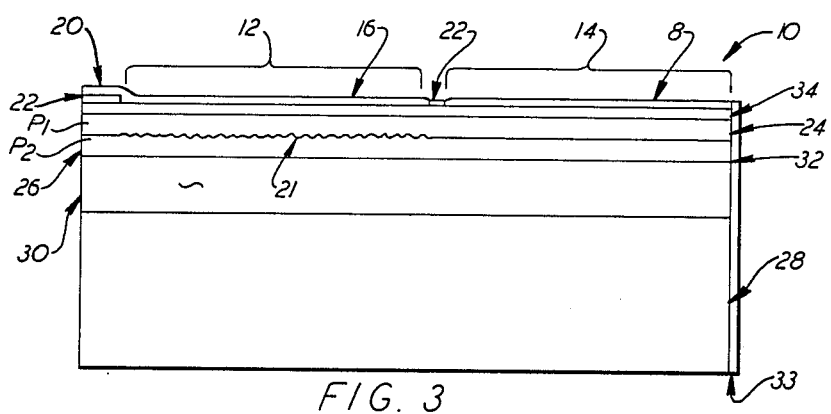
FIG. 3 is a longitudinal cross-section of the MOPA of FIG. 1.

FIG. 3 is a longitudinal cross-section of the MOPA 10 of FIG. 1. As can be seen in FIG. 3 the substrate 28, n-layer 30, active layer 32, upper cladding layer 24, lower cladding layer 26 and cap 34 are all common to both the MO 12 and PA 14 sections, extending the entire length of the MOPA 10.

An optical coating 33 is provided on the output facet of PA 14. The optical coating 33 is a quarter-wave anti-reflection coating of, for example, Alumina ($Al_2O_3$) or SiO.

The narrow stripe 16 of the MO section 12 is electrically separated from the amplifier stripe 18 of the PA 14 by the dielectric layer 22. It can thus be seen that the metallic layer 20 is divided into two sections: one extending the length and width of the MO 12 and the other extending the length and width of the PA 14.

The grating pattern 21 provides a resonator structure which provides the feedback necessary for the build-up of oscillation. (See, *Stimulated Emission in a Periodic Structure,* by J. Kogelnik and C.V. Shank, Applied Physics Letters, Vol. 18, No. 4, pp. 152-154 (1971)). The grating pattern 21 causes periodic feedback of one longitudinal mode of the laser which is distributed along the length of the MO 12. This results when the grating spacing is adjusted such that it diffracts the radiation in the waveguide into the opposite direction. It can thus be seen that by generating a grating pattern of sufficiently narrow line-width, on the order of 0.24 μm, the distributed feedback laser provides a mechanism to limit the longitudinal laser modes to one. The thickness of the lower cladding layer 26 is on the order of 0.3-0.5 um. The exact thickness of the lower cladding layer 26 is a function of the aluminum content in the lower cladding layer 26 and the active layer 32 as well as the depth of the grooves in the grating pattern 21.

In the form of FIG. 3 the beam of radiation expands in the active region 32 of PA 14 solely by diffraction. As is known, the angle of beam expansion in the PA 14 is $$\theta = \lambda / W_{in} \qquad (1)$$

where:
- λ = wavelength of coherent radiation emanating from MO 12
- $W_{in}$ = width of entrance to PA 14 in active region 32

As was discussed in application Ser. No. 780,879:

$$W_{out} = (P_{out}/P_{in})W_{in} \quad (2)$$

where:
- $W_{out}$ = width of the output facet 40 of PA 14
- $P_{out}$ = power of radiation emanating from facet 40 of PA 14
- $P_{in}$ = input power of radiation to PA 14
- $W_{in}$ = as above-described It can be appreciated, therefore, that for a given gain ($P_{out}/P_{in}$) and $W_{in}$, $W_{out}$ is constant. Since θ is fixed by equation 1, the beam expands at a constant rate to fill an output aperture $W_{out}$ of constant width. If follows, therefore, that the length of PA 14 is constant when the gain, $W_{in}$ and $W_{out}$ are constant.

Figure 4:
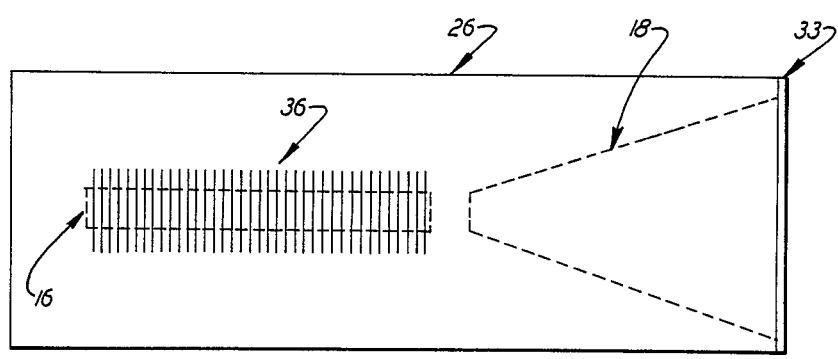
FIG. 4 is a plan view of one form of the active region of the MOPA of FIGS. 2 and 3.

FIG. 4 shows the grating pattern 21 as it has been generated on the surface of the lower cladding layer 26. For reference, the location of the narrow stripe 16 and the amplifier stripe 18 are shown in outline.

As an example, consider an MO 12 which is 250 micrometers in length having an active region 16 1.5 micrometers wide and 0.5 micrometers thick, resulting in a cross-sectional area of 0.75 square micrometers. Assuming a facet damage threshold of 20 milliwatts output per square micrometer yields an output power threshold for facet damage in MO 12 of 0.75×20=15 milliwatts. Allowing a safety factor of three, MO 12 can safely generate $P_{out}$ of 5 milliwatts. The entire output from MO 12 can be coupled directly into PA 14 with a diffraction angle of $θ = λ/W_{in}$. Assuming a vacuum wavelength ($λ_o$) of 800 nanometers and an index of refraction (n) of the device of 3.5, the wavelength of the device is $λ = λ_o/n = 230$ nanometers. The diffraction angle θ of the energy coupled into the PA 14 is 17.2 degrees. Preserving the input power density at the output of the PA 14 and designing for $P_{out} = 1$ watt dictates, from equation 2, that $W_{out} = 1000/5 \times 1.5 = 300$ micrometers. Accordingly, to achieve a 1 watt output form PA 14 with an input of 5 milliwatts from MO 12 active region in PA 14 which diverges at 17.2 degrees is required as is an output facet 40 width of 300 micrometers and a length of PA 14 of one millimeter.

There has thus been described a semiconductor light generating device that generates high power with high reliability, no facet damage, single spatial mode, narrow spectral mode, high modulation rates and an active area coextensive to and coplanar with the MO and PA.

While the present invention has been shown and described with reference to a preferred embodiment thereof, it will be understood by those skilled in the art that changes in form or details may be made therein without departing from the scope and intent of the invention. Accordingly, it is understood that the invention is to be broadly construed within the spirit and scope of the claims.

What is claimed is:

1. An integrated semiconductor radiation generating device comprising:
    distributed feedback laser diode means including a first active region wherein a laser beam is generated;
    optical power amplifier means optically coupled to said distributed feedback laser diode means and having an entrance width substantially equal to and coplanar with the exit of said distributed feedback laser diode means;
    said optical power amplifier means including a second active region for expanding and amplifying said laser beam prior to emission from said power amplifier means;
    means connected to said distributive feedback laser diode means and said optical power amplifier means for supplying pumping current to each independently of the other.

2. An integrated semiconductor radiation generating device as claimed in claim 1 wherein:
    said second active region increases in width in the amplifying direction.

3. An integrated semiconductor radiation generating device as claimed in claim 1 wherein:
    said first and said second active regions are substantially coplanar and of equal constant thickness.

4. An integrated semiconductor radiation generating device as claimed in claim 1 wherein said distributive feedback laser diode mans comprises:
    a periodic structure extending at least the length of said first active region producing internal optical feedback within said first active region.

5. An integrated semiconductor radiation generating device as claimed in claim 4 wherein:
    said optical power amplifier means includes layers of n and p doped material with said second active region disposed therebetween.

6. An integrated semiconductor radiation generating device as claimed in claim 5 wherein:
    said optical power amplifier means includes an output facet, said output facet having antirefleting properties.

7. An integrated semiconductor radiation generating device as claimed in claim 1 wherein said distributive feedback laser diode means comprise:
    said first active region disposed between a layer of n doped material and a first layer of p doped material;
    said first layer of p doped material having a diffraction grating generated on its surface;
    said diffraction grating being substantially as wide and substantially as long as said first active region;

8. An integrated semiconductor radiation generating device as claimed in claim 1 wherein said distributive feedback diode means includes means to modulate the laser radiation eminating therefrom.

* * * * *

UNITED STATES PATENT AND TRADEMARK OFFICE
CERTIFICATE OF CORRECTION

PATENT NO. : 4,744,089
DATED : May 10, 1988
INVENTOR(S) : Andrew H. Montroll and Steven H. Macomber It is certified that error appears in the above-identified patent and that said Letters Patent are hereby corrected as shown below:

Column 6, line 48, change "comprise:" to --comprises:--

Column 6, line 55, after "region;" insert -- a second layer of p doped material overlaying said first layer of p doped material.--

Signed and Sealed this

Twentieth Day of December, 1988

Attest:

DONALD J. QUIGG

*Attesting Officer*  *Commissioner of Patents and Trademarks*